(12) United States Patent
Kim et al.

(10) Patent No.: US 8,552,416 B2
(45) Date of Patent: Oct. 8, 2013

(54) QUANTUM DOT LIGHT EMITTING DIODE DEVICE AND DISPLAY DEVICE THEREWITH

(75) Inventors: Young-Mi Kim, Seoul (KR); Ho-Cheol Kang, Gyeonggi-do (KR); Ho-Jin Kim, Gyeonggi-do (KR); Chang-Hee Lee, Seoul (KR); Kook-Heon Char, Seoul (KR); Seong-Hoon Lee, Seoul (KR); Jeong-Hun Kwak, Seoul (KR); Wan-Ki Bae, Seoul (KR); Dong-Gu Lee, Gyeongsangnam-do (KR); Jae-Hoon Lim, Seoul (KR)

(73) Assignees: LG Display Co., Ltd., Seoul (KR); SNU R&DB Foundation, Seoul (KR)

( * ) Notice: Subject to any disclaimer, the term of this patent is extended or adjusted under 35 U.S.C. 154(b) by 18 days.

(21) Appl. No.: 13/115,537

(22) Filed: May 25, 2011

(65) Prior Publication Data
US 2011/0291071 A1    Dec. 1, 2011

(30) Foreign Application Priority Data
May 25, 2010    (KR) .................. 10-2010-0048569

(51) Int. Cl.
*H01L 29/06*    (2006.01)
(52) U.S. Cl.
USPC ......... 257/13; 257/E29.071; 438/962; 438/23
(58) Field of Classification Search
USPC .................. 257/13, E29.071; 438/962, 23
See application file for complete search history.

(56) References Cited

U.S. PATENT DOCUMENTS

| | | | |
|---|---|---|---|
| 6,563,527 B1 * | 5/2003 | Shimoda et al. | 347/240 |
| 2002/0106529 A1 * | 8/2002 | Okunaka et al. | 428/690 |
| 2007/0170401 A1 | 7/2007 | Hsu et al. | |
| 2010/0091225 A1 * | 4/2010 | Cho et al. | 349/105 |
| 2011/0140075 A1 * | 6/2011 | Zhou et al. | 257/13 |

FOREIGN PATENT DOCUMENTS

| | | |
|---|---|---|
| CN | 101110441 A | 1/2008 |
| CN | 101351851 A | 1/2009 |
| KR | 10-0807561 B1 | 2/2008 |
| WO | 2009/123763 A2 | 10/2009 |

OTHER PUBLICATIONS

Office Action by the Korean Patent Office dated Jan. 25, 2013 in Korean counterpart patent application No. 10-2010-0048569.
The First Office Action by The State Intellectual Property Office of the People's Republic of China dated May 24, 2013 in Chinese counterpart patent application No. 201110144312.6.

* cited by examiner

*Primary Examiner* — Julio J Maldonado
*Assistant Examiner* — Amar Movva
(74) *Attorney, Agent, or Firm* — Morgan, Lewis & Bockius LLP

(57) ABSTRACT

The present invention relates to a quantum dot light emitting diode device in which a hole transportation layer is formed after forming a quantum dot light emitting layer by a solution process by applying an inverted type quantum dot light emitting diode device for making free selection of a hole transportation layer material that enables easy injection of a hole to the quantum dot light emitting layer; and display device and method therewith.

12 Claims, 8 Drawing Sheets

QUANTUM DOT LIGHT EMITTING DIODE DEVICE AND DISPLAY DEVICE THEREWITH

CROSS REFERENCE TO RELATED APPLICATION

This application claims the benefit of the Patent Korean Application No. 10-2010-0048569, filed on May 25, 2010, which is hereby incorporated by reference as if fully set forth herein.

BACKGROUND OF THE DISCLOSURE

1. Field of the Disclosure

The present invention relates to quantum dot light emitting diode devices, and more particularly to a quantum dot light emitting diode device in which a hole transport layer is formed after forming a quantum dot light emitting layer by a solution process to form an inverted type quantum dot light emitting diode device for making free selection of a hole transport layer material that enables easy injection of a hole to the quantum dot light emitting layer; and a display device therewith.

2. Discussion of the Related Art

Importance of the display device is being further emphasized as a visual information transmission media in an information oriented society, and in order to occupy a major position in the future, the display device is required to meet requirements of being thinner and lighter, and having less power consumption and a better picture quality.

Of the display devices, recently, a quantum dot light emitting diode device is under research, which enables display by using a light emitting material, to fabricate a slim display device, and to drive for a long time, and has high color purity.

The quantum dot QD is a nano particle. The quantum dot with a diameter of a nanometer size emits a light as an unstable electron moves down from a conduction band to a valence band, wherein the wave length of the light from the quantum dot becomes the shorter as a size of a quantum dot particle is the smaller, and the longer as the size of the quantum dot particle is the greater. These are unique electric and optical characteristics which are different from present semiconductor material. Therefore, by controlling the size of the quantum dot, a visible light of a desired wave length can be produced, and by varying the size and composition of the quantum dot, a variety of colors can be produced.

In comparison to a general organic light emitting diode device, the quantum dot light emitting diode device is a display device which uses the quantum dot instead of an organic light emitting material as a material of the light emitting layer. Though an Organic Light Emitting Diode OLED which uses the organic light emitting material produces single color of white, red, blue or so on depending on a kind of the device, the organic light emitting diode has a limitation in expressing many color lights brilliantly. Opposite to this, since the quantum dot light emitting diode device can produce a desired natural color by controlling the size of the quantum dot, has a good color reproduction ratio, and brightness which does not fall behind the light emitting diode, the quantum dot light emitting diode device is spot lighted as a material which can supplement drawbacks of the light emitting diode LED which is paid attention as a next generation light source.

A structure of a general quantum dot light emitting diode device will be described.

FIGS. 1A and 1B illustrate a schematic section of a general quantum dot light emitting diode device and a diagram of a band gap energy thereof.

Referring to FIGS. 1A and 1B, a general quantum dot light emitting diode device is provided with an anode 10 and a cathode 50 opposite to each other on a substrate 100, a quantum dot light emitting layer 30 between the anode 10 and the cathode 50, a hole transport layer 20 between the anode and the quantum dot light emitting layer 30, and an electron transport layer 40 between the quantum dot light emitting layer 30 and the cathode 50.

The quantum dot light emitting layer 30 is filled with a plurality of quantum dots 31 each with a diameter of a nano size, formed, for an example, by coating a quantum dot solution having the quantum dots 31 dissolved in a solvent on the hole transport layer 20 by a solution process and volatilize the solvent.

The hole transport layer 20 makes injection of the hole from the anode 10 easy, and serves to transport the hole to the quantum dot light emitting layer 30.

The electron transport layer 40 makes injection of the electron from the cathode easy, and serves to transport the electron to the quantum dot light emitting layer.

The quantum dot light emitting layer 30 is formed by applying a quantum dot material by the solution process for receiving the hole from the hole transport layer 20 and the electron from the electron transport layer 40 and combining the hole and the electron to emit a light.

In this instance, each of the quantum dots 31 has a core 33 component at a center for emitting the light, a shell at a surface thereof for protection, and a ligand 35 component covering a shell surface for spreading the solvent.

In this instance, since the core 33, the shell 34, and the ligand 35 have band gap energy differences different from one another due to difference of components, such that the farther from the core 33, the greater the band gap energy difference. In this case, when the hole is transported from the hole transport layer 20 to the quantum dot 31, the shell 34 or the ligand 35 becomes to have an HOMO energy level lower than the HOMO energy level of the core 33, acting as an energy barrier at the time the hole is transported to the quantum dot. Alikely, at the time the electron is transported to the quantum dot light emitting layer 30 from the electron transport layer 40, an LUMO energy level of the shell 34 or the ligand 35c of the quantum dot becomes higher than the LUMO energy level of the core, making the shell 34 of the ligand to act as the energy barrier.

In the meantime, as shown in the drawings, it can be known that the energy barrier is very high at the time of hole transportation relative to transportation of the electron, because the HOMO energy level of the shell or ligand of the quantum dot light emitting layer 30 is very low in comparison to the high HOMO energy level of the hole transportation layer 20 at the time the hole is transported from the hole transport layer 20 to the quantum dot light emitting layer 30. Consequently, it can be foreseen that the hole injection into the quantum dot light emitting layer 30 is difficult to cause poor light emitting efficiency, to require a high driving voltage for making the quantum dot light emitting layer 30 to emit the light and to have poor light emitting efficiency.

Moreover, in a process the quantum dot light emitting layer 30 is formed on the hole transport layer 20 by the solution process, the solvent which is used for forming the quantum dot light emitting layer 30 causes to dissolve a component of the hole transport layer 20. Since formation of the hole transport layer 20 which will not be dissolved by the solvent is a key, presently materials for forming the hole transport layer 20 are limited.

As a spontaneous light emitting device, the related art organic light emitting layer has the following problems.

First, the great hole energy barrier between the hole transport layer and the quantum dot light emitting layer makes hole transportation to the quantum dot light emitting layer difficult, to require a high driving voltage, and to cause poor light emitting efficiency due to the difficulty in transportation of the hole.

Second, at the time of fabrication of the general quantum dot light emitting diode device, the quantum dot light emitting layer is formed on the hole transport layer by the solution process. Since, at the time the quantum dot light emitting layer is formed, the component of the hole transport layer under the quantum dot light emitting layer is also dissolved, to required to select a material that will not be dissolved in the solution process, hole transportation layer materials are limited.

SUMMARY OF THE DISCLOSURE

Accordingly, the present invention is directed to a quantum dot light emitting diode device, a display device therewith, and methods for fabricating the same.

An object of the present invention is to provide a quantum dot light emitting diode device in which a hole transportation layer is formed after forming a quantum dot light emitting layer by a solution process to from an inverted type quantum dot light emitting diode device for making free selection of a hole transportation layer material that enables easy injection of a hole to the quantum dot light emitting layer, a display device therewith, and methods for fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a quantum dot light emitting diode device includes a cathode formed on a substrate, a quantum dot light emitting layer formed on the cathode, and an anode formed on the quantum dot light emitting layer.

The device can further include an electron transport layer between the cathode and the quantum dot light emitting layer.

And, the device can further include a hole transport layer between the quantum dot light emitting layer and the anode.

And, it is preferable that the quantum dot light emitting layer includes a 2 group-6 group pair or 3 group-5 group pair nano-semiconductor compound. For an example, the nano-semiconductor compound is any one selected from CdSe, CdS, CdTe, ZnSe, ZnTe, ZnS, HgTe, InAs, InP, and GaAs.

And, the hole transport layer can be formed of any one selected from CBP, α-NPD, TCTA and DNTPD, or NiO, or $MoO_3$.

And, the electron transport layer can be formed of any one selected from ZnO, $TiO_2$, $WO_3$, and $SnO_2$, or TPBI and TAZ. In this instance, it is preferable that the electron transport layer has a cross linkable structure.

In another aspect of the present invention, a display device includes a transparent cathode formed on a substrate, a quantum dot light emitting layer formed on the cathode to include quantum dots, an anode formed on the quantum dot light emitting layer, and a thin film transistor connected to the cathode.

And, in another aspect of the present invention, a display device includes a cathode formed on a substrate, a quantum dot light emitting layer formed on the cathode to include quantum dots, a transparent anode formed on the quantum dot light emitting layer, and a thin film transistor connected to the cathode.

In another aspect of the present invention, a display device includes a cathode formed on a first substrate, a quantum dot light emitting layer formed on the cathode to include quantum dots, a transparent anode formed on the quantum dot light emitting layer, a thin film transistor formed on the first substrate connected to the cathode, and a second substrate opposite to the first substrate, the second substrate having a color filter layer.

And, in another aspect of the present invention, a method for fabricating a quantum dot light emitting diode device includes the steps of forming a cathode on a substrate, forming an electron transport layer on the cathode, forming a quantum dot light emitting layer on the electron transport layer by a solution process, forming a hole transport layer on the quantum dot light emitting layer, and forming an anode on the hole transport layer.

And, in another aspect of the present invention, a method for fabricating a display device includes the steps of forming a cathode on a substrate, forming an electron transport layer on the cathode, forming a quantum dot light emitting layer filled with a plurality of quantum dots on the electron transport layer by a solution process, forming a hole transport layer on the quantum dot light emitting layer, forming an anode on the hole transport layer, and forming a thin film transistor connected to the cathode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1A:
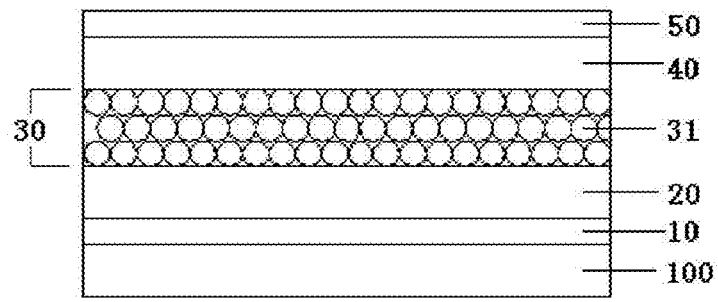
FIGS. 1A and 1B respectively illustrate a section of a general quantum dot light emitting diode device and a band gap energy diagram thereof, schematically.
Figure 1B:
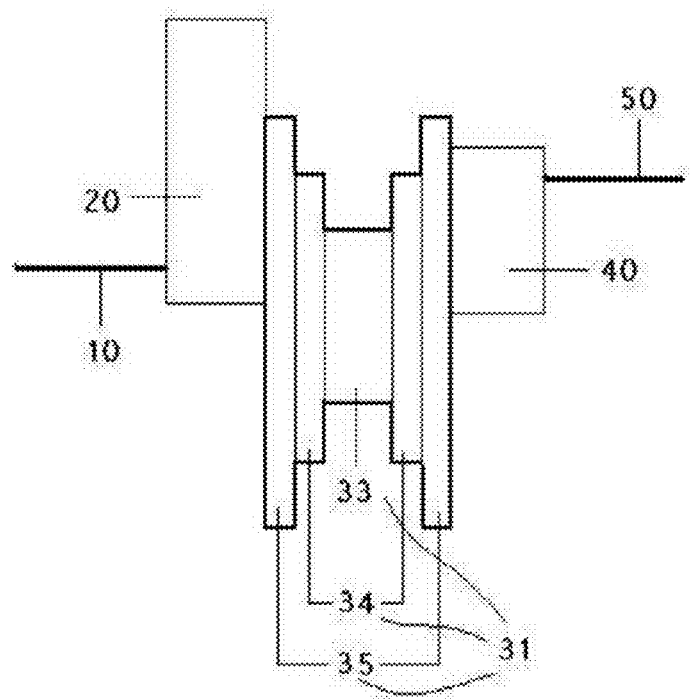
Figure 2:
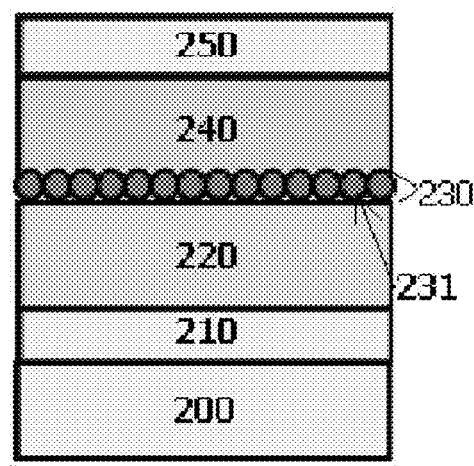
FIG. 2 illustrates a section of a quantum dot light emitting diode device in accordance with a preferred embodiment of the present invention, schematically.

FIG. 2 illustrates a section of a quantum dot light emitting diode device in accordance with a preferred embodiment of the present invention, schematically.

Referring to FIG. 2, the quantum dot light emitting diode device includes a cathode 210 formed on a substrate 200, a quantum dot light emitting layer 230 formed on the cathode 210, and an anode 250 formed on the quantum dot light emitting layer 230.

The quantum dot light emitting diode device can further include an electron transport layer ETL 220 between the cathode 250 and the quantum dot light emitting layer 230, and a hole transport layer 240 between the anode 250 and the quantum dot light emitting layer 230. In the meantime, the electron transport layer and the hole transport layer can be formed together with the quantum dot light emitting layer.

In the meantime, the quantum dot light emitting layer 230 is a layer filled with quantum dots with diameters of 1 nm~100 nm of 2 group-6 group pair or 3 group-5 group pair nano-semiconductor compound.

Each of the quantum dots 231 has a core component at a center for emitting the light, a shell which covers a surface of the core component, and a ligand component which covers a surface of the shell for spreading a solvent. Depending on cases, the ligand is a component that can be removed when the quantum dot light emitting layer is formed.

For an example, the nano-semiconductor compound of the quantum dot can be any one selected from CdSe, CdS, CdTe, ZnSe, ZnTe, ZnS, HgTe, InAs, $Cd_{1-x}Zn_xSe_{1-y}S_y$, CdSe/ZnS, InP, and GaAs.

In this instance, the quantum dot light emitting layer 230 is filled with a plurality of quantum dots 231 of nano-sized diameters, formed, for an example, by coating a solution of the quantum dots in a solvent on the electron transport layer 220 by the solution process, and volatilizing the solvent.

And, the electron transport layer 220 makes electron injection from the cathode 210 easy, and serves to transport the electron to the quantum dot light emitting layer 230.

The electron transport layer 220 can be formed of an inorganic oxide material of ZnO, $TiO_2$, $WO_3$, or $SnO_2$, or an organic material of TPBI (1,3,5-tris(N-phenylbenzimidazol-2-yl)benzene) or TAZ (3-(4-biphenyl)-4-phenyl-5-t-butylphenyl-1,2,4-triazole). If the electron transport layer is formed of the organic material, it is preferable that electron transport layer has a cross linkable structure for preventing electron transport layer suffer from damage in the solution process at the time the quantum dot light emitting layer 230 is formed on the electron transport layer.

The hole transport layer 240 makes injection of the hole from the anode 250 easy, and serves to transmits the hole to the quantum dot light emitting layer 230.

The hole transport layer 240 can be formed of organic or inorganic material selected from organic material of CBP (4,4'-N,N'-dicarbazole-biphenyl), α-NPD (N,N'-diphenyl-N, N'-bis(1=naphtyl)-1,1'-biphenyl-4,4"-diamine), TCTA (4,4', 4"-tris(N-carbazoly)-triphenylamine) and DNTPD (N,N'-di (4-(N,N'-diphenyl-amino)phenyl)-N,N'-diphenylbenzidine) or from inorganic material of NiO, or $MoO_3$.

The quantum dot light emitting layer 230 is a layer which combines the hole and the electron respectively from the electron transport layer ETL 220 and the hole transport layer 240 to emit the light formed of the quantum dot material by the solution process.

In this instance, since the hole transport layer 240 is formed after the quantum dot light emitting layer 230 is formed by the solution process, there is no damage to the hole transport layer 240 caused in formation of the quantum dot light emitting layer 230, providing a wide range of material selection of the hole transport layer, and selection of a material having a high HOMO (Highest Occupied Molecular Orbital) level becomes easy.

In the meantime, the cathode 210 and the anode 250 are formed of a metal oxide or other non-oxide inorganic material including metal, meeting a transparent/non-transparent condition, respectively.

A display device having the inverted type quantum dot light emitting diode device applied thereto will be described.

First Embodiment

Figure 3:
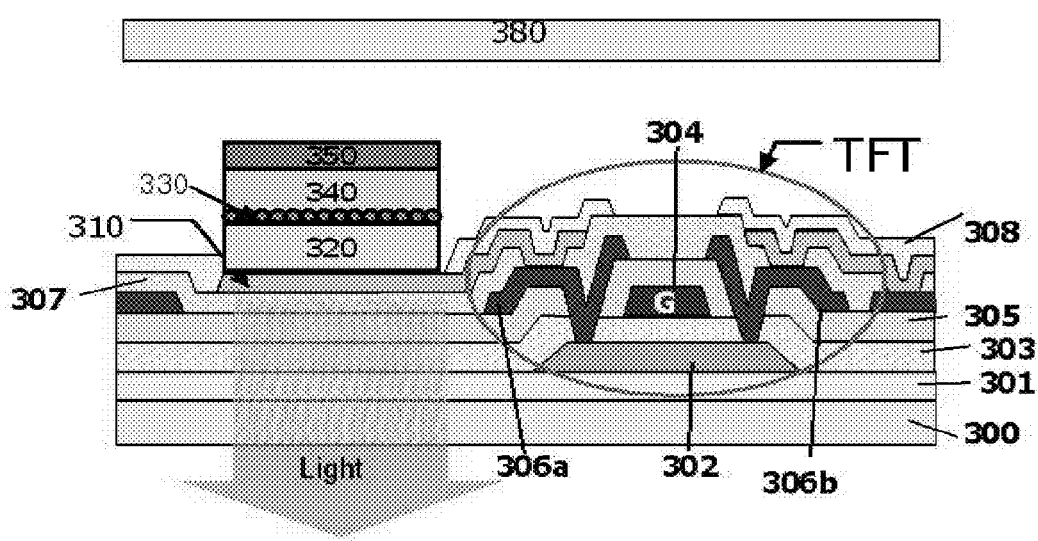
FIG. 3 illustrates a section of a display device in accordance with a first preferred embodiment of the present invention.

FIG. 3 illustrates a section of a display device in accordance with a first preferred embodiment of the present invention.

Referring to FIG. 3, the display device which is a bottom emission type includes a transparent cathode 310 on a substrate 300, a quantum dot light emitting layer 330 formed on the cathode 310 to have quantum dots, an anode 350 on the quantum dot light emitting layer 330, and a thin film transistor TFT connected to the cathode 310.

The display device can further include an electron transport layer 320 between the cathode 310 and the quantum dot light emitting layer 330, and a hole transport layer 340 between the quantum dot light emitting layer 330 and the anode 350.

The cathode 310 is formed of a transparent conductive metal, such as ITO, IZO, ITZO, AZO for downward light emission, and the anode 350 is formed of a non-transparent metal. For an example, the anode 350 can be formed of one selected from Calcium Ca, aluminum Al, magnesium Mg, silver Ag, barium Ba, or an alloy including any one of above.

The quantum dot light emitting layer 330 having the quantum dots can be formed at a pixel region of the substrate 300 selectively, enabling to form the hole transport layer 340 and the electron transport layer 320 to have widths the same with a width of the quantum dot light emitting layer 330, or on the substrate 300 overlapped with the quantum dot light emitting layer 330 as shown in the drawing. In a latter case, the hole transport layer 340 and the electron transport layer 320 can be formed on an entire surface of the substrate 300.

The anode 350 is formed on the hole transport layer 340, and depending on cases, if the hole transport layer 340 is formed on an entire surface of the substrate 300, the anode 350 can be formed together with the hole transport layer 340 on an entire surface of the substrate.

And, opposite to the substrate 300, an encapsulation substrate 380 can be formed for capping and protection of the substrate 300. And, though not shown, sealant is placed between edges of the encapsulation substrate 380 and the substrate 300 for bonding the two substrates. This is for protecting the hole transport layer 340 and the electron transport layer 320 from water or other external environment when the hole transport layer 340 or the electron transport layer 320 is formed of an organic material.

In the meantime, the thin film transistor TFT is formed at every crossed portion of gate lines (not shown) and data lines (not shown) running perpendicular to each other to form a pixel region at every crossed portion thereof, and includes a gate electrode 304 projected from the gate line, a semiconductor layer 302 under the gate electrode 304, and a source electrode 306b and a drain electrode 306a positioned on opposite sides of the gate electrode 304 connected to both sides of the semiconductor layer 302, respectively. In this instance, the source electrode 306b is projected from the data line and the drain electrode 306a is connected to the transparent cathode 310.

A fabricating method in accordance with a first preferred embodiment of the present invention will be described.

A buffer layer 301 is formed on a substrate 300. The buffer layer 301 protects the substrate 300 at the time a semiconductor layer 302 is formed, and serves to prevent impurity from introducing to the semiconductor layer 302 from the substrate 300.

Then, the semiconductor layer 302 is formed on a predetermined portion of the buffer layer 301.

Then, a first interlayer insulating film 302 is formed on the buffer layer 301 including the semiconductor layer 302.

Then, a gate electrode 304 is formed on the first interlayer insulating film 302 to match with a center of the semiconductor layer 302, and a gate line (not shown) is formed in one direction to include the gate electrode 304.

Then, a gate insulating film 305 is formed on the first interlayer insulating film 302 including the gate electrode 304 and the gate line.

Then, the gate insulating film 305 and the first interlayer insulating film 302 are removed selectively to form a first contact hole to expose an upper side of the semiconductor layer 302.

A source electrode 306b and a drain electrode 306a are formed to be in contact with the semiconductor layer through the contact hole, and a data line (not shown) is formed in a direction perpendicular to the gate line as one unit with the source electrode 306b.

Then, a second interlayer insulating film 307 is formed on an entire surface including the source electrode 306b, the drain electrode 306a, and the data line, and removed selectively to form a second contact hole which exposes a predetermined portion of the drain electrode 306a.

A cathode 310 is formed on the second interlayer insulating film 307 such that the cathode 310 is in contact with the drain electrode 306a through the second contact hole.

A protective film 308a is formed on the second interlayer insulating film 307 to expose only a portion over the cathode 310.

Then, an electron transport layer 320, a quantum dot light emitting layer 330, a hole transport layer 340, and a anode 350 are formed on an exposed cathode 310 in succession.

In this instance, the quantum dot light emitting layer 330 is formed by dispersing a plurality of quantum dots in a solvent, coating quantum dot solution on the electron transport layer 302, and volatilizing a solvent component, to leave the quantum dots, only.

In this case, the electron transport layer 302 and the hole transport layer 340 can be formed by the solution process identical to formation of the quantum dot light emitting layer 330, or by vacuum deposition. In a case of the solution process, in order to prevent dissolution in a successive solution process, it is preferable that, in each of the solution processes of the layers, a material remained after the volatilization of the solvent which is to form a desired layer is cured in a cross linkable structure.

Moreover, the section in FIG. 3 illustrates only one pixel region. In this instance, if it is assumed that the quantum dot light emitting layer emits a color light, other pixel region has a quantum dot light emitting layer which emits other color light, enabling to produce many color lights.

Second Embodiment

Figure 4:
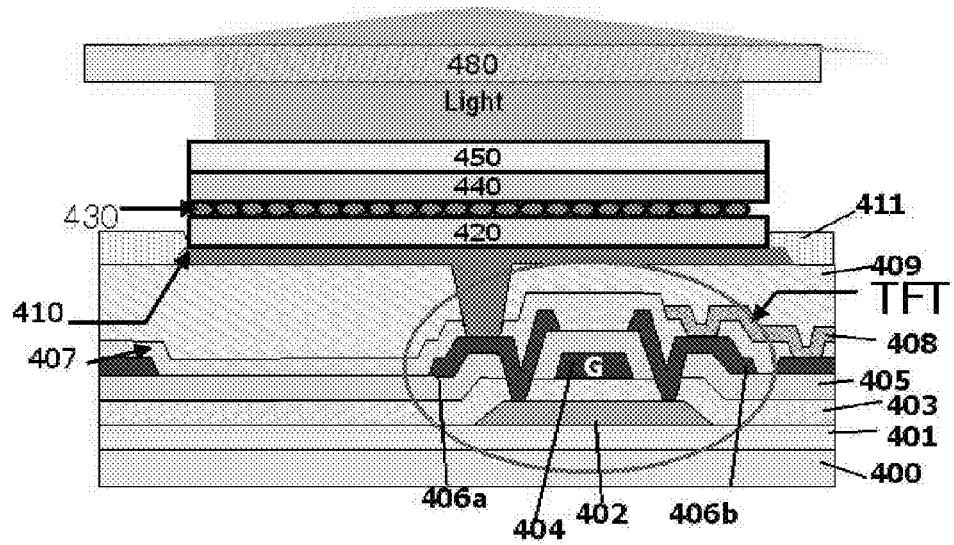
FIG. 4 illustrates a section of a display device in accordance with a second preferred embodiment of the present invention.

FIG. 4 illustrates a section of a display device in accordance with a second preferred embodiment of the present invention.

Referring to FIG. 4, the display device includes a cathode 410 on a substrate 400, a quantum dot light emitting layer 430 formed on the cathode 410 to have quantum dots, a transparent anode 450 on the quantum dot light emitting layer 430, and a thin film transistor TFT connected to the cathode 410.

The display device can further include an electron transport layer 420 between the cathode 410 and the quantum dot light emitting layer 430, and a hole transport layer 440 between the quantum dot light emitting layer 430 and the anode 450.

The anode 450 is formed of a transparent conductive metal, such as ITO, IZO, ITZO, AZO for upward light emission, and the cathode 410 is formed of a non-transparent metal. For an example, the anode 450 can be formed of one selected from Calcium Ca, aluminum Al, magnesium Mg, silver Ag, barium Ba, or an alloy including any one of above.

The quantum dot light emitting layer 430 having the quantum dots can be formed at a pixel region of the substrate 400 selectively, enabling to form the hole transport layer 440 and the electron transport layer 420 to have widths the same with a width of the quantum dot light emitting layer 430, or on the substrate 400 overlapped with the quantum dot light emitting layer 430 as shown in the drawing. In a latter case, the hole transport layer 440 and the electron transport layer 420 can be formed on an entire surface of the substrate 400.

And, opposite to the substrate 400, an encapsulation substrate 480 can be formed for capping and protection of the substrate 400. And, though not shown, sealant is placed between edges of the encapsulation substrate 480 and the substrate 400 for bonding the two substrates. This is for protecting the hole transport layer 440 and the electron transport layer 420 from water or other external environment when the hole transport layer 440 or the electron transport layer 420 is formed of an organic material.

Because the display device in accordance with the second preferred embodiment of the present invention has the cathode and anode materials exchanged for the upward light emission, with parts except above left identical to the first embodiment, description of identical parts and fabrication method will be omitted.

Unexplained reference numerals of 401 denotes a buffer layer, 402 denotes a semiconductor layer, 403 denotes a first interlayer insulating film, 404 denotes a gate electrode, 405 denotes a gate insulating film, 406a denotes a drain electrode, 406b denotes a source electrode, 407 denotes a second interlayer insulating film, 408 denotes an electrode line, 409 denotes a third interlayer insulating film, and 411 denotes a protective film.

Third Embodiment

Figure 5:
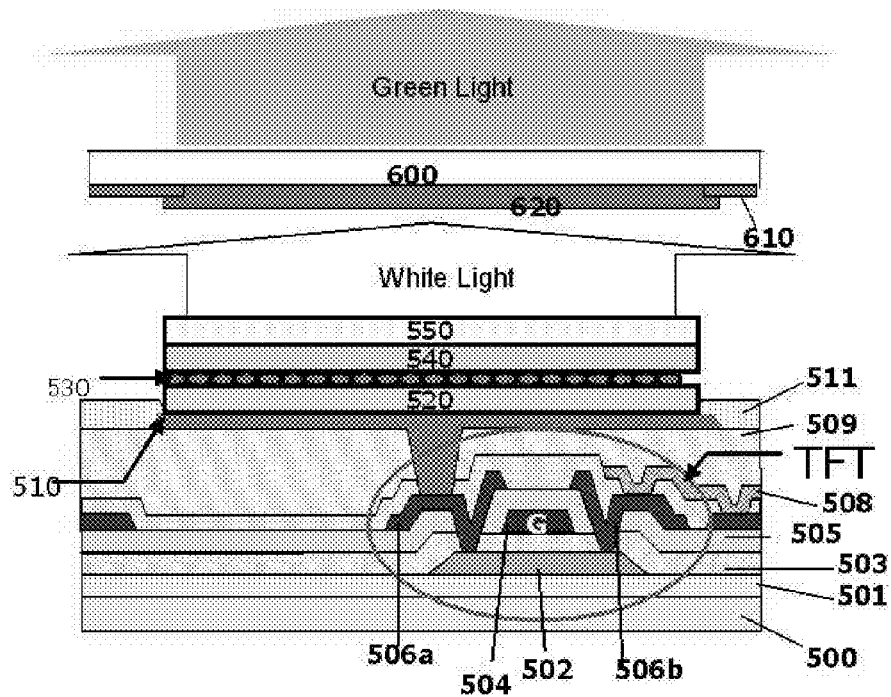
FIG. 5 illustrates a section of a display device in accordance with a third preferred embodiment of the present invention.

FIG. 5 illustrates a section of a display device in accordance with a third preferred embodiment of the present invention.

Referring to FIG. 5, the display device includes a cathode 510 on a first substrate 500, a quantum dot light emitting layer 530 formed on the cathode 510 to have quantum dots 531, a transparent anode 550 on the quantum dot light emitting layer 530, a thin film transistor TFT formed on the first substrate 500 connected to the cathode 510, and a second substrate 600 formed opposite to the first substrate 500 to have a color filter layer 620.

The display device can further include an electron transport layer 520 between the cathode 510 and the quantum dot light emitting layer 530, and a hole transport layer 540 between the quantum dot light emitting layer 530 and the anode 550.

The quantum dot light emitting diode device QLED on the first substrate 500 and the TFT are identical to a structure on the substrate in the second embodiment.

However, with regard to the quantum dot light emitting layer 530 of the quantum dot light emitting diode device QLED, though the quantum dot light emitting layer in the second embodiment includes quantum dots which emit primary colors of R, G, and B, the quantum dot light emitting layer 530 in the third embodiment includes quantum dots which emit a white color. However, the quantum dot light emitting layer 530 in the third embodiment can include R quantum dots, G quantum dots, and B quantum dots mixed in an equal ratio, or can include a stack of an R quantum dot light emitting layer, a G quantum dot light emitting layer, and a B quantum dot light emitting layer.

The color filter layer 620 is positioned on the second substrate 600 which is opposite to the quantum dot light emitting layer 530, and a black matrix layer 610 is formed on the second substrate 600 opposite to regions excluding the pixel region. As shown, the color filter layer 620 can overlap with the black matrix layer 610 at both edges thereof, and the color filter layer 620 can have color filters of different colors matched to the pixel regions respectively to display colors different from one another. For an example, R, G, B color filters are formed respectively matched to different pixel regions for enabling to change a white color light emitted to the underlying first substrate 500 to various colors.

Figure 6:
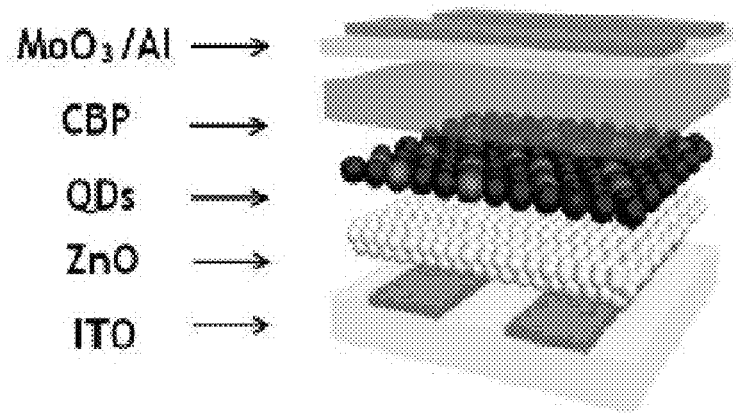
FIGS. 6 and 7 illustrate an exploded perspective view of an exemplary stacking of a quantum dot light emitting diode device and a band gap energy diagram of layers thereof, respectively.
Figure 7:
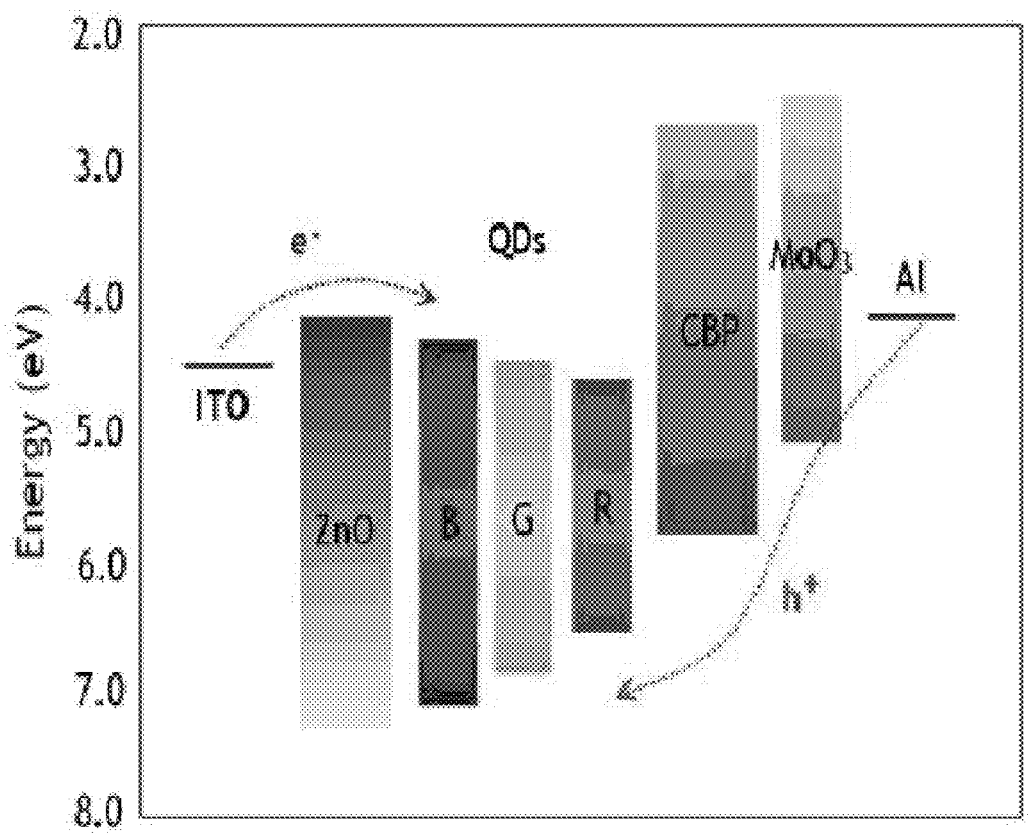

FIGS. 6 and 7 illustrate an exploded perspective view of an exemplary stacking of a quantum dot light emitting diode device and a band gap energy diagram of layers thereof, respectively.

FIG. 6 illustrates an exemplary display device in accordance with the first preferred embodiment of the present invention, including a stack of, starting from a bottom, a cathode of ITO on a substrate, an electron transport layer of ZnO, a quantum dot light emitting layer, a hole transport layer of CBP, and an anode of Al.

In this instance, as a hole injection layer, an $MoO_3$ layer is further included under the anode.

FIG. 7 illustrates a graph showing a band gap energy diagram of layers of above display device. It can be known that the band gap energy of the quantum dot light emitting layer varies with R, G, B colors, and it can be known that the a difference of the band gap energy becomes smaller in an order to B→G→R. As shown, it can be known that, in injection of the hole from the hole injection layer of CBP to the quantum dot light emitting layer, though there are differences among colors, there is a hole energy barrier from about 0.7 eV to 2 eV.

Figure 8:
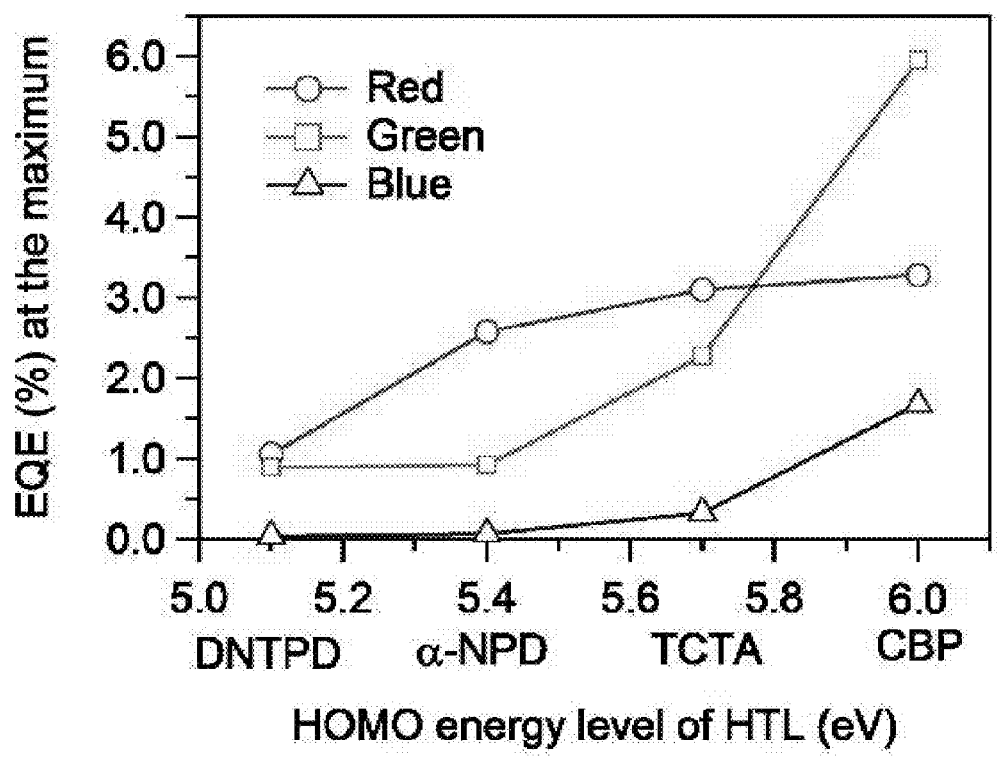
FIG. 8 illustrates a graph showing quantum efficiency versus a level of a hole transport layer.

FIG. 8 illustrates a graph showing quantum efficiency versus a level of a hole transport layer.

FIG. 8 illustrates a graph showing quantum efficiency versus a level of a hole transport layer according to a material thereof in the quantum dot light emitting diode device of the present invention, wherein it can be known that the higher the HOMO energy level of each of the materials, the higher the external quantum efficiency (%) EQE.

Figure 9:
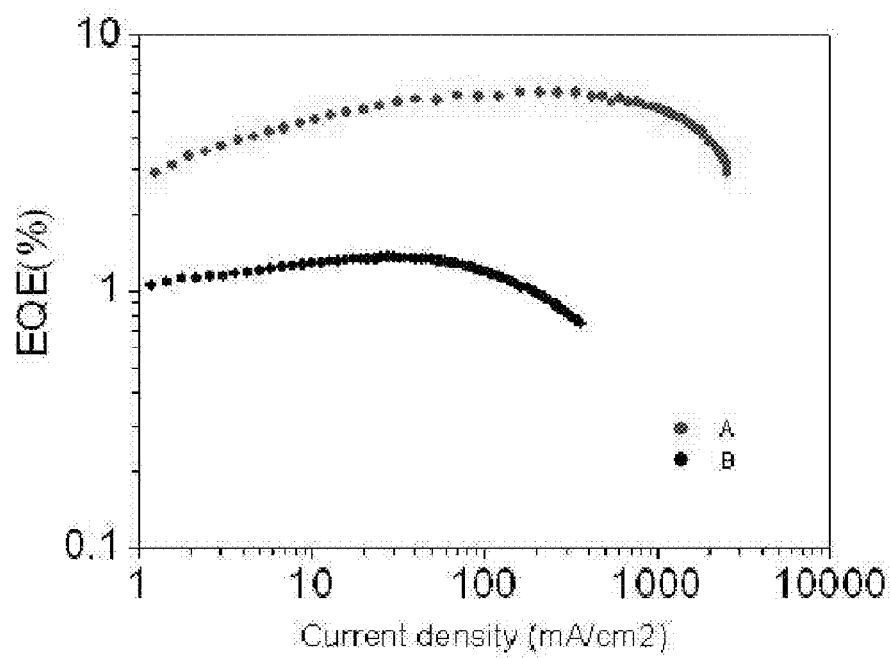
FIG. 9 illustrates a graph showing quantum efficiency versus a current density of a general quantum dot light emitting diode device and a quantum dot light emitting diode device in accordance with a preferred embodiment of the present invention, respectively.

FIG. 9 illustrates a graph showing quantum efficiency versus a current density of a general quantum dot light emitting diode device and a quantum dot light emitting diode device in accordance with a preferred embodiment of the present invention, respectively.

FIG. 9 illustrates a comparative graph of quantum efficiency versus a current density of a general quantum dot light emitting diode device B and an inverted type quantum dot light emitting diode device in accordance with a preferred embodiment of the present invention A respectively, wherein it can be known that the inverted type quantum dot light emitting diode device in accordance with a preferred embodiment of the present invention A has the quantum efficiency about 3 times higher than the general quantum dot light emitting diode device B regardless of the current density.

Figure 10:
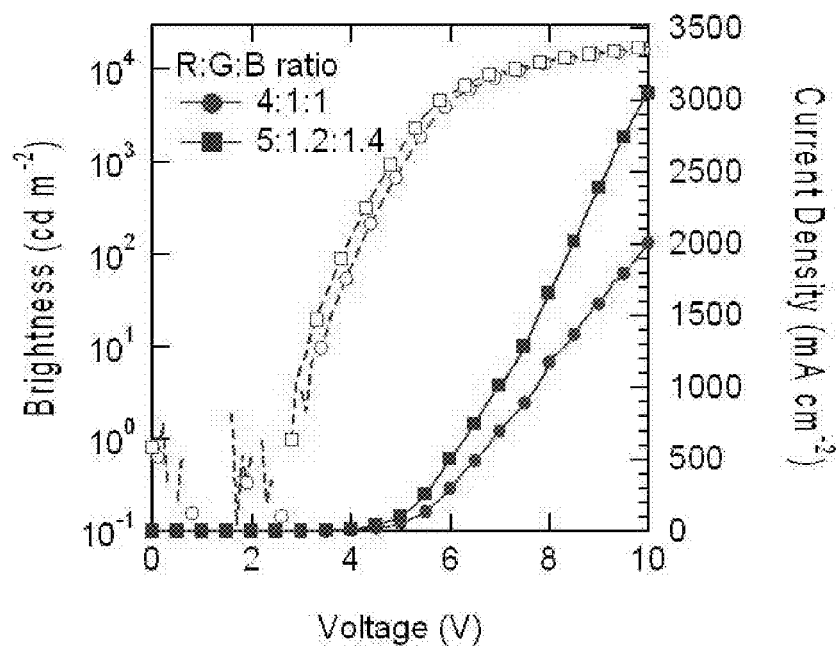
FIG. 10 illustrates a graph showing brightness and current density versus a voltage of a display device in accordance with a third preferred embodiment of the present invention.
Figure 11:
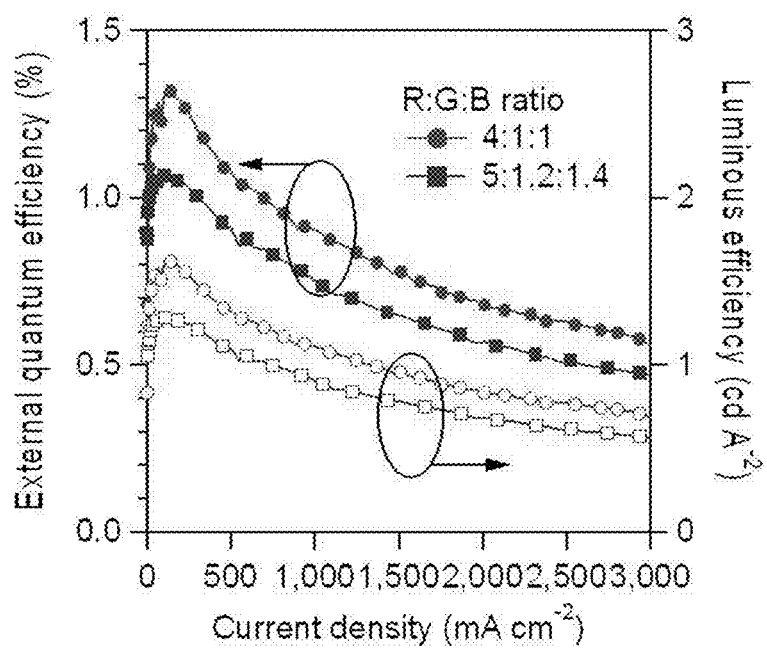
FIG. 11 illustrates a graph showing external quantum efficiency and luminous efficiency versus current density of a display device in accordance with a third preferred embodiment of the present invention.

FIG. 10 illustrates a graph showing brightness and current density versus a voltage of a display device in accordance with a third preferred embodiment of the present invention, and FIG. 11 illustrates a graph showing external quantum efficiency and luminous efficiency versus current density of a display device in accordance with a third preferred embodiment of the present invention.

Ratios of R, G, B quantum dots in the quantum dot light emitting layer set to be 4:1:1 and 5:1.2:1.4 are applied to the display device in accordance with the third preferred embodiment of the present invention as shown in FIG. 10 for comparison.

In this case, it can be known that, when the driving voltage is set to be 10V, the brightness is higher than 10,000 cd/m$^2$ regardless the quantum dot ratios.

And, in a case the B quantum dot ratio is greater than the G quantum dot ratio, it can be known that the current density is good relatively.

And, referring to FIG. 11, it can be known that the external quantum efficiency has a maximum value at the current density of 500 mAcm$^{-2}$. For an example, the external quantum efficiency is maximum 1.3% when the R, G, B quantum dot ratio is set to be 4:1:1.

Figure 12:
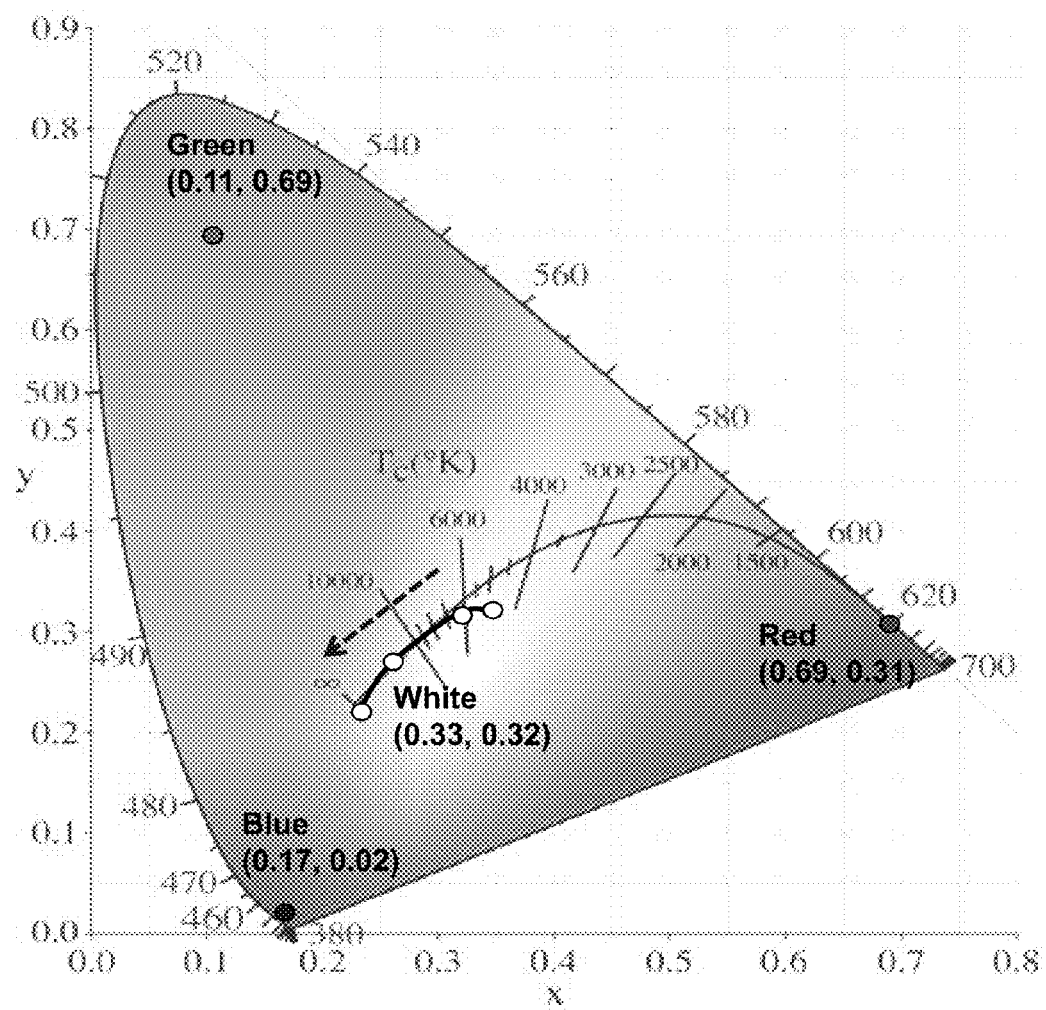
FIG. 12 illustrates a graph showing a chromaticity of a white light from a display device in accordance with a third preferred embodiment of the present invention.

FIG. 12 illustrates a graph showing a chromaticity of a white light from a display device in accordance with a third preferred embodiment of the present invention.

Referring to FIG. 12, it can be known that, the chromaticity of a white light being about (0.33, 0.32), it is possible to display a white color in a level similar to a general quantum dot light emitting diode device.

In the meantime, the R, G, B quantum dots are semiconductor nano-particles. The quantum dot with a diameter of 1~100 nanometer emits a light as an unstable electron moves down from a conduction band to a valence band, wherein the wave length of the light from the quantum dot becomes the shorter as a size of a quantum dot particle is the smaller, and the wave length of the light from the quantum dot becomes the longer as the size of the quantum dot particle is the greater. These are unique electric and optical characteristics which are different from present semiconductor material. Therefore, by controlling the size of the quantum dot, a visible light of a desired wave length can be produced, and by varying the size of the quantum dot, a variety of colors can be produced.

The quantum dot light emitting diode device of the present invention is fabricated by starting to form the cathode on the substrate in an inverted type, and forming the hole transport layer on the quantum dot light emitting layer which is formed by the solution process. Eventually, a material selection range of the hole transport layer is made greater, to select the material from materials having various HOMO energy levels. According to this, since there is no damage even if a material of the hole transport layer which has a high HOMO energy level and good internal quantum efficiency is used, a secure quantum dot light emitting diode device can be produced.

Moreover, since the quantum dot light emitting diode device can produce a desired natural color by controlling the size of the quantum dot, has a good color reproduction ratio, and brightness not fall behind a light emitting diode, the quantum dot light emitting diode device is spot lighted as a material which can supplement drawbacks of the light emitting diode LED which is paid attention as a next generation light source.

Furthermore, by forming the light emitting layer of inorganic quantum dots which can be driven for a long time without influence from water or external environment, a long lifetime of the quantum dot light emitting diode device can be expected.

As have been described, the quantum dot light emitting diode device, the display device therewith, and the methods for fabricating the same of the present invention have the following advantages.

First, by forming the quantum dot light emitting diode device in the inverted type in an order of the cathode, the electron transport layer, the quantum dot light emitting layer, the hole transport layer, and the anode, enabling to form the hole transport layer after formation of the quantum dot light emitting layer by the solution process, the quantum dot light emitting diode device can be formed without damage to the hole transport layer having a great hole barrier, enabling to have a wide range of selection of the hole transport layer materials. That is, the formation of the hole transport layer after application of the solution process for forming the quantum dot light emitting layer permits to prevent the hole transport layer from dissolving in the solution process.

Second, the easy selection of the hole transport layer material to have an HOMO level higher than the HOMO level of the quantum dot light emitting layer permits to reduce the driving voltage, improve efficiency, and reduce power consumption.

Third, the reduction of the device reduces heat generation from the device, which increases a lifetime.

Fourth, the formation of the quantum dot light emitting diode device of an inorganic material leads to have high color purity and not to be vulnerable to water, thereby reducing a cost and a lifetime in comparison to other flat display devices.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A quantum dot light emitting diode device comprising:
a cathode formed on a substrate, wherein the cathode is connected to a thin film transistor on the substrate;
an electron transport layer on the cathode, wherein the electron transport layer has a cross linkable structure;
a quantum dot light emitting layer formed on the electron transport layer, wherein the quantum dot light emitting layer is formed by a solution process;
a hole transport layer on the quantum dot light emitting layer; and
an anode formed on the hole transport layer.

2. The device as claimed in claim 1, wherein the quantum dot light emitting layer includes a 2 group-6 group pair or 3 group-5 group pair nano-semiconductor compound.

3. The device as claimed in claim 2, wherein the nano-semiconductor compound is any one selected from CdSe, CdS, CdTe, ZnSe, ZnTe, ZnS, HgTe, InAs, InP, and GaAs.

4. The device as claimed in claim 2, wherein the electron transport layer further comprises any one selected from ZnO, $TiO_2$, $WO_3$, and $SnO_2$.

5. The device as claimed in claim 2, wherein the electron transport layer further comprises TPBI or TAZ.

6. The device as claimed in claim 1, wherein the hole transport layer is formed of any one selected from CBP, α-NPD, TCTA and DNTPD.

7. The device as claimed in claim 1, wherein the hole transport layer is formed of NiO, or $MoO_3$.

8. A display device comprising:
a transparent cathode formed on a substrate;
an electron transport layer on the transparent cathode, wherein the electron transport layer has a cross linkable structure;
a quantum dot light emitting layer formed on the electron transport layer to include quantum dots, wherein the quantum dot light emitting layer is formed by a solution process;
a hole transport layer on the quantum dot light emitting layer;
an anode formed on the hole transport layer; and
a thin film transistor connected to the cathode.

9. A display device comprising:
a cathode formed on a substrate;
an electron transport layer on the cathode, wherein the electron transport layer has a cross linkable structure;
a quantum dot light emitting layer formed on the electron transport layer to include quantum dots, wherein the quantum dot light emitting layer is formed by a solution process;
a hole transport layer on the quantum dot light emitting layer;
a transparent anode formed on the hole transport layer; and
a thin film transistor connected to the cathode.

10. A display device comprising:
a cathode formed on a first substrate;
an electron transport layer on the cathode, wherein the electron transport layer has a cross linkable structure;
a quantum dot light emitting layer formed on the electron transport layer to include quantum dots, wherein the quantum dot light emitting layer is formed by a solution process;
a hole transport layer on the quantum dot light emitting layer;
a transparent anode formed on the hole transport layer;
a thin film transistor formed on the first substrate connected to the cathode; and a second substrate opposite to the first substrate, the second substrate having a color filter layer.

11. A method for fabricating a quantum dot light emitting diode device comprising the steps of:
   forming a cathode on a substrate, wherein the cathode is connected to a thin film transistor on the substrate;
   forming an electron transport layer on the cathode, wherein the electron transport layer has a cross linkable structure;
   forming a quantum dot light emitting layer on the electron transport layer by a solution process;
   forming a hole transport layer on the quantum dot light emitting layer; and
   forming an anode on the hole transport layer.

12. A method for fabricating a display device comprising the steps of:
   forming a thin film transistor on a substrate;
   forming a cathode on the substrate, connected to the thin film transistor;
   forming an electron transport layer on the cathode, wherein the electron transport layer has a cross linkable structure;
   forming a quantum dot light emitting layer filled with a plurality of quantum dots on the electron transport layer by a solution process;
   forming a hole transport layer on the quantum dot light emitting layer; and
   forming an anode on the hole transport layer.

* * * * *